US006441718B1

(12) United States Patent
Smejkal et al.

(10) Patent No.: US 6,441,718 B1
(45) Date of Patent: Aug. 27, 2002

(54) OVERLAY SURFACE MOUNT RESISTOR

(75) Inventors: Joel J. Smejkal; Steve E. Hendricks, both of Columbus, NE (US)

(73) Assignee: Vishay Dale Electronics, Inc., Columbus, NE (US)

( * ) Notice: Subject to any disclaimer, the term of this patent is extended or adjusted under 35 U.S.C. 154(b) by 0 days.

(21) Appl. No.: 09/715,252

(22) Filed: Nov. 17, 2000

Related U.S. Application Data

(62) Division of application No. 09/471,622, filed on Dec. 21, 1999.

(51) Int. Cl.[7] .................................................. H01L 1/14

(52) U.S. Cl. ....................... 338/329; 338/195; 338/206; 338/283; 338/293; 338/287; 338/275

(58) Field of Search ................................ 338/322, 329, 338/328, 283, 293, 287, 275, 195, 206

(56) References Cited

U.S. PATENT DOCUMENTS

| | | | | | |
|---|---|---|---|---|---|
| 696,757 | A | | 4/1902 | Rypinski | |
| 765,889 | A | | 7/1904 | Harris | |
| 779,737 | A | | 1/1905 | Robinson | |
| 859,255 | A | | 7/1907 | Roller | |
| 1,050,563 | A | | 1/1913 | Roller | |
| 1,260,252 | A | * | 3/1918 | Apfel | 338/254 |
| 1,829,553 | A | * | 10/1931 | Andre | 338/293 |
| 2,003,625 | A | | 6/1935 | Boyer | |
| 2,009,732 | A | * | 7/1935 | Harper et al. | 338/293 |
| 2,271,995 | A | | 2/1942 | Baroni | |
| 2,360,265 | A | * | 10/1944 | Osterheld | 338/293 |
| 2,518,941 | A | * | 8/1950 | Satchwell et al. | 338/287 |
| 2,640,906 | A | * | 6/1953 | Haynes | 338/254 |
| 2,708,701 | A | | 5/1955 | Viola | |
| 2,736,785 | A | | 2/1956 | Du Bois | |
| 2,745,931 | A | * | 5/1956 | Heibel | 338/254 |
| 3,245,021 | A | | 4/1966 | Kernander et al. | |
| 4,228,344 | A | * | 10/1980 | Boos et al. | 219/270 |
| 4,286,249 | A | | 8/1981 | Lewis et al. | |
| 4,306,217 | A | * | 12/1981 | Solow | 338/275 |
| 4,345,235 | A | * | 8/1982 | Riley et al. | 338/293 |
| 4,529,958 | A | * | 7/1985 | Person et al. | 338/293 |
| 4,684,916 | A | | 8/1987 | Ozawa | |
| 4,689,475 | A | | 8/1987 | Kleiner et al. | |
| 4,800,253 | A | | 1/1989 | Kleiner et al. | |
| 4,993,142 | A | | 2/1991 | Burke et al. | |
| 5,604,477 | A | | 2/1997 | Rainer et al. | |
| 6,148,502 | A | * | 11/2000 | Gerber et al. | 338/293 |
| 6,232,869 | B1 | * | 5/2001 | Choi | 338/280 |

FOREIGN PATENT DOCUMENTS

| | | |
|---|---|---|
| DE | 30 40 630 A | 12/1982 |
| DE | 6 93 20 911.8 | 6/1995 |

OTHER PUBLICATIONS

Advances In Connector Design Using Electron Beam Welded Strip Nov. 1978 issue of: Electronic Packaging and Production.

* cited by examiner

*Primary Examiner*—Karl D. Easthom
(74) *Attorney, Agent, or Firm*—McKee, Voorhees & Sease, P.L.C.

(57) ABSTRACT

A surface mount resistor includes an elongated piece of resistive material having strips of conductive material attached to its opposite ends. The strips of conductive material are separated to create an exposed central portion of the resistive material therebetween. According to the method the resistive strip is attached to a single co-extensive strip of conductive material and a central portion of the conductive material is removed to create the exposed central portion of the resistive strip.

8 Claims, 7 Drawing Sheets

OVERLAY SURFACE MOUNT RESISTOR

CROSS-REFERENCE TO A RELATED APPLICATION

This application is a division of application Ser. No. 09/471,622, filed Dec. 21, 1999.

BACKGROUND OF THE INVENTION

The present invention relates to an overlay surface mount resistor and method for making same.

Surface mount resistors have been available for the electronics market for many years. Their construction has comprised a flat rectangular or cylindrically shaped ceramic substrate with a conductive metal plated to the ends of the ceramic to form the electrical termination points. A resistive metal is deposited on the ceramic substrate between the terminations, making electrical contact with each of the terminations to form an electrically continuous path for current flow from one termination to the other.

An improvement in surface mount resistors is shown in U.S. Pat. No. 5,604,477. In this patent a surface mount resistor is formed by joining three strips of material together in edge to edge relation. The upper and lower strips are formed from copper and the center strip is formed from an electrically reactive material. The resistive material is coated with a high temperature coating and the upper and lower strips are coated with tin or solder. The strips may be moved in a continuous path for cutting, calibrating, and separating to form a plurality of electrical resistors.

A primary object of the present invention is the provision of an improved overlay surface mount resistor and method for making same.

A further object of the present invention is the provision of an improved overlay surface mount resistor and method for making same which reduces the number of steps and improves the speed of production from that shown in U.S. Pat. No. 5,604,477.

A further object of the present invention is the provision of an improved overlay surface mount resistor and method for making same wherein the resulting resistor is efficient in operation and improved in quality.

A further object of the present invention is the provision of an overlay surface mount resistor and method for making same which is economical to manufacture, durable in use and efficient in operation.

SUMMARY OF THE INVENTION

The foregoing objects may be achieved by a surface mount resistor comprising an elongated resistance piece of electrically resistive material having first and second end edges, opposite side edges, a front face and a rear face. The resistance piece of resistive material includes a plurality of slots formed in its side edges that create a serpentine current path for current moving between the first and second ends or the resistor.

First and second conductive pieces of conductive metal are each formed with a front face, a rear face, first and second opposite side edges, and first and second opposite and edges. The first and second conductive pieces each have their front faces in facing engagement and attached to the front face of the resistive material and are spaced apart from one another to create an exposed area of the front face of the resistive material therebetween. A dielectric material covers the exposed area of the front face of the resistive material.

The method of the present invention includes taking elongated resistive strip of electrically resistive material having first and second opposite ends, an upper edge, a lower edge, a front flat face, and a rear flat face. The method includes joining a first elongated conductive strip and a second elongated conductive strip of conductive material to the front flat face of the resistive strip in spaced relation to one another so as to create an exposed portion of the front flat face of the resistive strip between the first and second conductive strips. The joined strips are then sectioned into a plurality of separate body members. Next a plurality of slots are cut through the exposed portion of the resistive strip to create a serpentine current path in the resistive material of each of the body members. Next the resistive strips of each body member are encapsulated in a coating of electrically insulating material.

According to one feature of the invention, the attaching step comprises attaching an elongated wide conductive strip over substantially the entire surface of the front face of the resistive strip and then removing a central portion of the wide conductive strip to create the first and second elongated conductive strips and the exposed portion of the elongated resistive strip therebetween.

DETAILED DESCRIPTION OF THE PREFERRED EMBODIMENT

Figure 1:
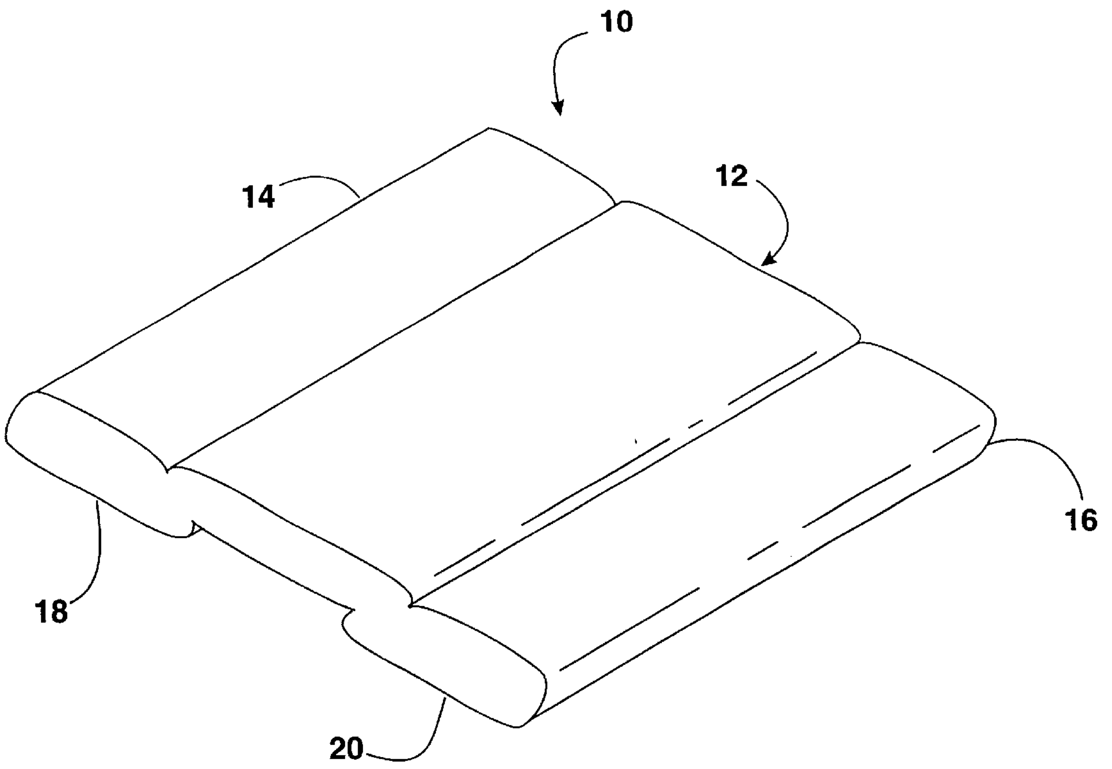
FIG. 1 is a perspective view of a resistor made according to the present invention.

Referring to FIG. 1 the numeral 10 generally designates the surface mount resistor of the present invention.

Resistor 10 includes a central portion 12, first termination 14, and second termination 16. Terminations 14, 16 each include on their lower surfaces a first standoff 18 and a second standoff 20 respectively. Standoffs 18,20 permit the resistor to be mounted on a surface with the central portion 12 spaced slightly above the surface of the circuit board.

Figures 2, 2A:
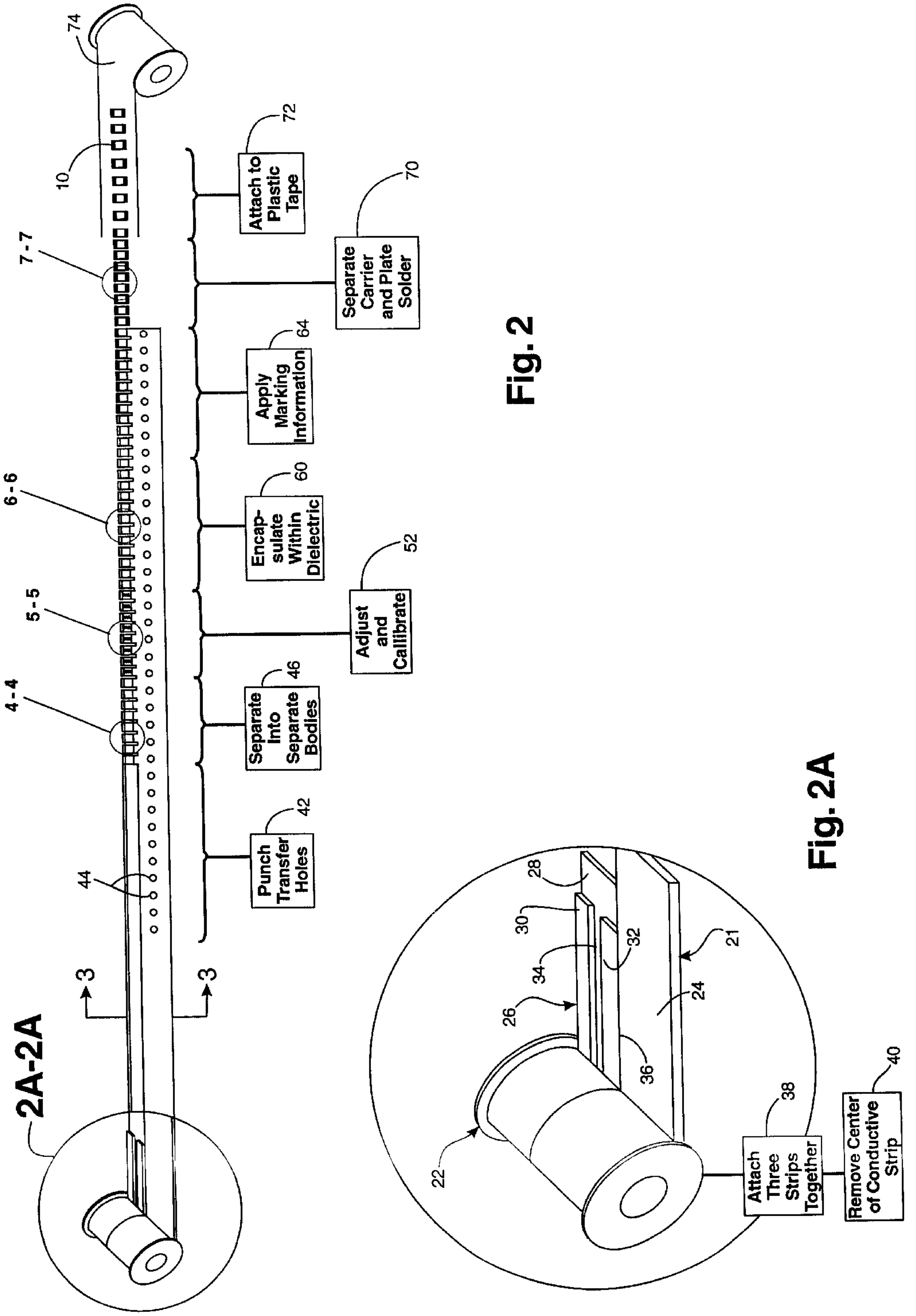
FIG. 2 is a schematic flow diagram showing the process for making the present resistor.
FIG. 2A is an enlarged view taken along line 2A—2A of FIG. 2.

Referring to FIGS. 2 and 2A, a reel 22 comprising a plurality of strips joined together into one continuous ribbon designated by the numeral 21. Ribbon 21 comprises a carrier strip 24 which is welded to an overlay strip 26 along a weld line 36. Overlay strip 26 comprises a resistive strip 28 having first and second conductive strips 30, 32 attached to one surface thereof.

The method for manufacturing the continuous ribbon 21 is as follows: Beginning with a strip of metallic resistance material 28 of the proper width and thickness and a single strip of copper of the same width, the two metals are joined together through a metal cladding process to form overlay strip 26. The cladding process is a process well known in the art for joining dissimilar metals through the application of extremely high pressure without braising alloys or adhesives. The resulting overlay strip 26 is of double thickness, one thickness being the copper strip and one thickness being the resistive strip.

Figure 3A:
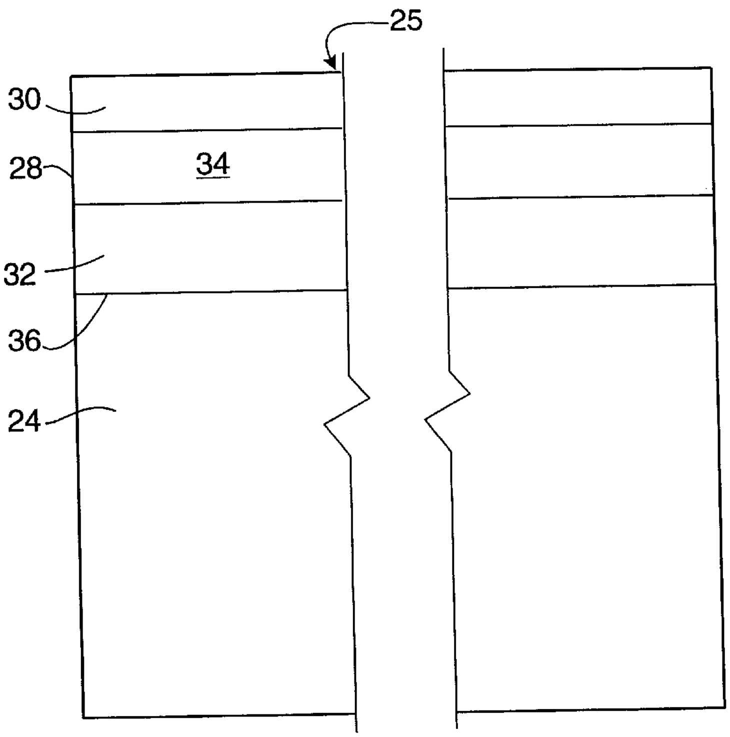
FIG. 3A is a partial elevational view of the ribbon of FIG. 3.
Figure 3:
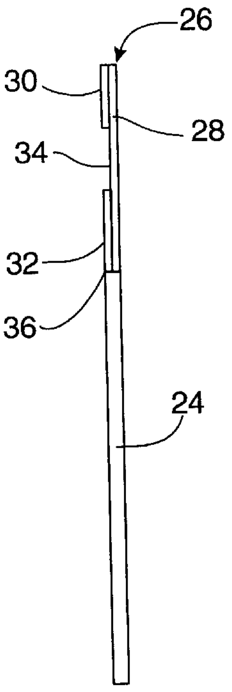
FIG. 3 is a sectional view taken along line 3—3 of FIG. 2.

The next step in the process involves removing a center portion of the conductive strip so as to create the upper conductive strip 30 and the lower conductive strip 32 with an exposed portion 34 therebetween. The removal may be accomplished by grinding, milling, skiving (shaving) or any other technique well known in the art for removing metal. Once removed, the exposed portion 34 electrically separates the upper conductive strip 30 and the lower conductive strip 32. This can be readily seen in FIGS. 3 and 3A. In FIG. 2A the block 38 represents the attaching of the carrier strip 24 to the overlay strip 26 by welding, and the block 40 represents the removal of the center of the conductive strip to create the upper and lower conductive strips 30, 32.

Next in the manufacturing process is the punching step represented by block 42 in FIG. 2. In this punching step holes 44 are punched in the carrier ribbon to permit the ribbon to be indexed throughout the remainder of the manufacturing process.

Figure 4:
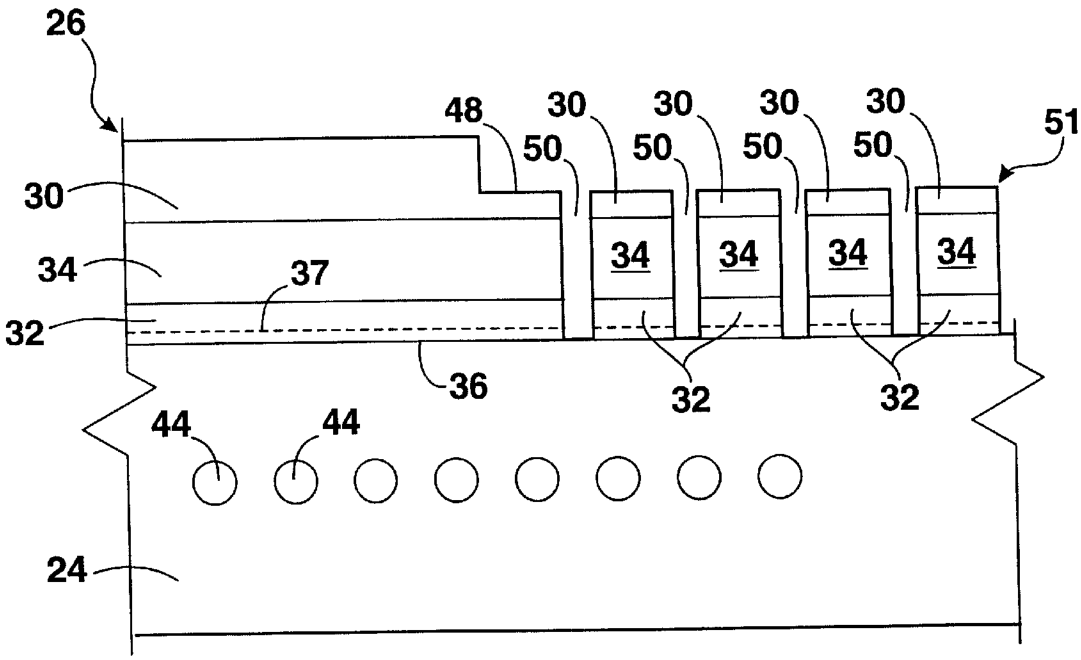
FIG. 4 is an enlarged view taken along line 4—4 of FIG. 2.

Next the block 46 represents the separating step for separating each of the various electrical resistors into separate bodies. This step in shown in detail in FIG. 4. The upper portion of overlay strip 26 is trimmed to create the upper edges 40 of each of the body members. Then a vertical separating slot 50 is cut or stamped between each of the bodies 51.

A cut line is represented by the dotted line 37, and represents where a cut will be performed later in the process. Slots 50 extend below cut line 37.

Figure 5:
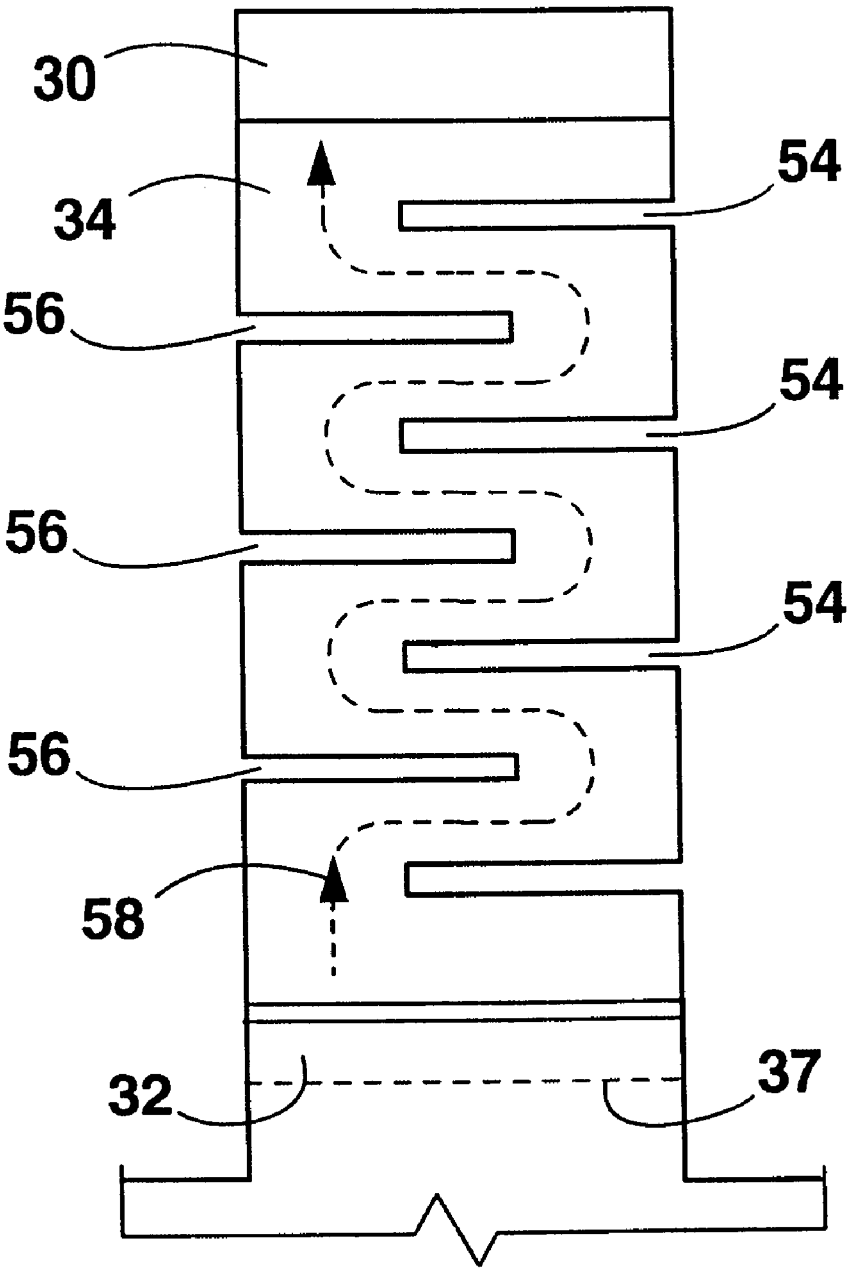
FIG. 5 is an enlarged view taken along line 5—5 of FIG. 2.

The separated resistor bodies are next moved to an adjustment and calibration station 52. At this station each body is adjusted to the desired resistance value. Resistance value adjustment is accomplished by cutting alternative slots 54, 56 (FIG. 5) through the exposed portion 34 of the resistance material of resistance strip 20. This forms a serpentine current path designated by the arrow 58. The serpentine path increases the resistance value of the resistor. The slots are cut through the resistance material using preferably a laser beam or any instrument used for the cutting of metallic materials. The resistance value of each resistor is continuously monitored during the adjustment cutting until the desired resistance is achieved.

Figure 6:
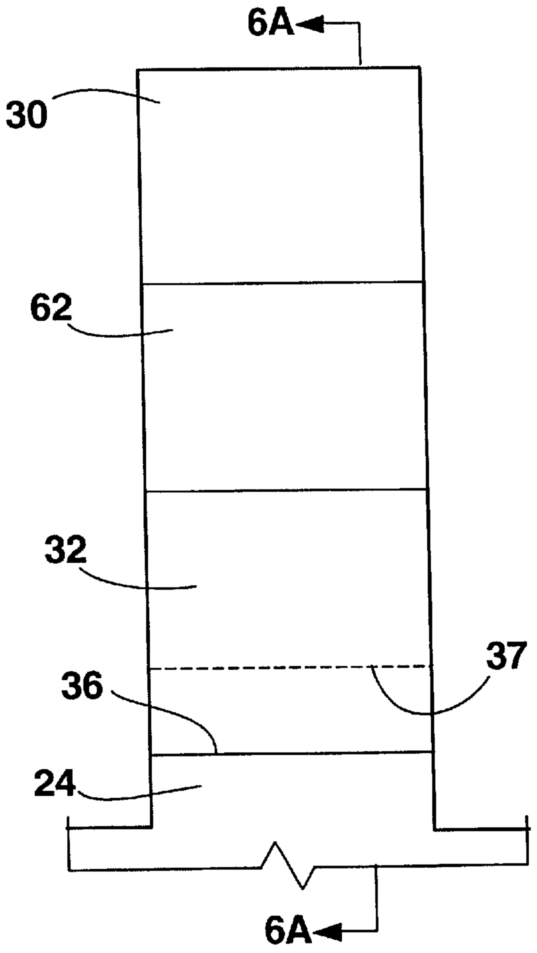
FIG. 6 is an enlarged view taken along line 6—6 of FIG. 2.
Figure 6A:
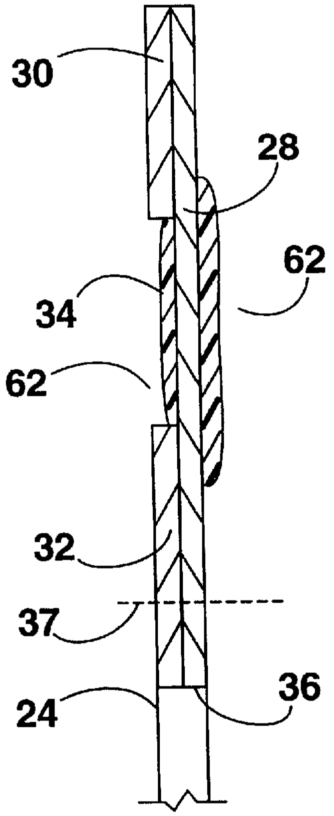
FIG. 6A is a sectional view taken along line 6A—6A of FIG. 6.

After the resistors are adjusted to their proper resistance value the bodies are moved to an encapsulation station 60 where a dielectric encapsulating material 62 is applied to the exposed front and rear surfaces and edges of the resistive strip 28. The purposes of the encapsulating operation are to provide protection from various environments to which the resistor may be exposed; to add rigidity to the resistance element which has been weakened by the value adjustment operation; and to provide a dielectric insulation to insulate the resistor from other components or metallic surfaces it may contact during its actual operation. The encapsulating material 62 is applied in any manner which covers only the resistive element materials 28. A liquid high temperature coating material roil coated to both sides of the resistor body is the preferred method. The conductive elements 30, 32 of each body are left exposed. These conductive strips 30, 32 of the resistor serve as electrical contact points for the resistor when it is fastened to the pointed circuit board by the end user. Since the ends 30, 32 on the resistor are thicker than the resistive element 28 in the center of the resistor, the necessary clearance is provided for the encapsulation on the bottom side of the resistor as shown in FIG. 6A.

Figure 7:
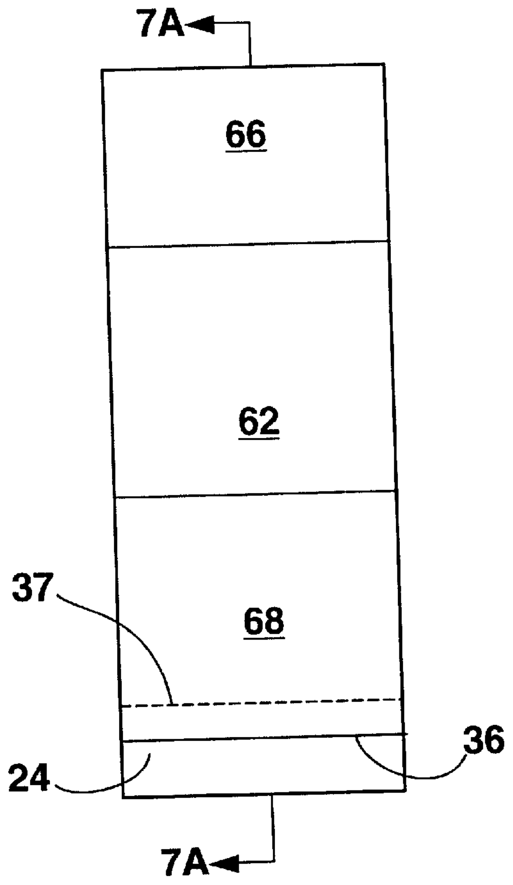
FIG. 7 is an enlarged view taken along line 7—7 of FIG. 2.
Figure 7A:
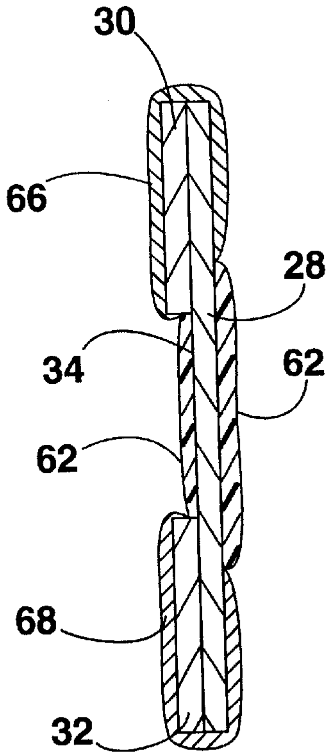
FIG. 7A is a sectional view taken along line 7A—7A of FIG. 7.

Next in the manufacturing process is the application of marking information, printing, to the encapsulated front surface of the resistor. This step is represented by block 64 in FIG. 2. This is accomplished by transfer printing the necessary information on the front surface of the resistor with marking ink. The strip is then moved to the separating station represented by block 70 where the individual resistors are cut away from the carrier strip 24. The individual resistors are plated with solder to create a solder coating 68 as shown in FIG. 7A. The individual resistors 10 are then complete and they are attached to a plastic tape 74 at a packaging station represented by the numeral 72.

The above process can be accomplished in one continuous operation as illustrated in FIG. 2 or it is possible to do the various operations one at a time on the complete strip for example, the attachment and removing steps can be accomplished either before or after the continuous ribbon 21 is wound on a spool. The punching of the transfer holes 44, the trimming and the separation can then be accomplished by unwinding the spool and moving the strip through stations 46, 52, 60 to accomplish these operations. Similar operations can be accomplished one at a time by unwinding the spool for each operation.

For the welding of weld joint 36 the preferred method of welding is by electron beam welding. However, other types of welding or attachment may be used. The preferred method for forming the transfer holes, for trimming the upper edge of the strip to length, and forming the separate resistor blanks is punching. However, other methods such as cutting with lasers, drilling, etching, or grinding may be used.

The preferred method for calibrating the resistor is to cut the resistor with a laser. However, punching, milling, grinding or other conventional means may be used.

The dielectric material used for the resistor is preferably a rolled high temperature coating, but various types of paint, silicon, and glass in the forms of liquid, powder or paste may be used. They may be applied by molding, spraying, brushing or static dispensing.

The marking ink used for the resistor is preferably a white liquid, but various colors and types of marking ink may be used. They may be applied by transfer pad, ink jet, transfer roller. The marking may also be accomplished by use of a marking laser beam.

The solder used in the present invention may be a plating which is preferable, or a conventional solder paste or hot tin dip may be used.

In the drawings and specification there has been set forth a preferred embodiment of the invention, and although specific terms are employed, these are used in a generic and descriptive sense only and not for purposes of limitation. Changes in the form and the proportion of parts as well as in the substitution of equivalents are contemplated as circumstances may suggest or render expedient without departing from the spirit or scope of the invention as further defined in the following claims.

What is claimed is:

1. A surface mount resistor comprising:

an elongated resistance piece of electrically resistive material having fire and second end edges, opposite side edges, a front face, and a rear face;

a plurality of slots formed in said opposite side edges to create a serpentine path for current moving between said first and second end edges;

first and second conductive pieces of conductive metal each having a front face, a rear face, opposite side edges, and first and second opposite end edges;

said first and second conductive pieces each having their front faces in facing engagement and attached to said front face of said resistive material, and being spaced apart from one another to create an exposed area of said front face of said resistive material therebetween;

said first and second opposite end edges of both of said first and second conductive pieces being registered with, or located between said first and second end edges and the opposite side edges of said elongated resistance piece;

a dielectric material covering and surrounding a central portion of said resistance piece, said central portion including said exposed front face of said resistance piece and a portion of said rear face of said resistance piece opposite to said exposed front face;

said rear faces of said first and second conductive pieces being flat and presenting a flat surface protruding beyond said dielectric for connecting to a circuit board.

2. A surface mount resistor according to claim 1 wherein said first end edge of said first conductive piece is in registered alignment with said first end edge of said resistance piece, and said first end edge of said second conductive piece is in registered alignment with said second end edge of said resistance piece.

3. A surface mount resistor according to claim 2 wherein said opposite side edges of said first and second conductive pieces are in registered alignment with said opposite edges of said resistance piece, respectively.

4. A surface mount resistor according to claim 1 wherein said resistance piece and said first and second conductive pieces provide a double thickness adjacent said first and second end edges of said resistance piece and only said resistance piece provides a single thickness adjacent said exposed portion thereof.

5. A surface mount resistor comprising:

an elongated resistance piece of electrically resistive material having first and second end edges, opposite side edges, a front face, and a rear face;

first and second conductive pieces of conductive metal each having a front face, a rear face, opposite said edges, and first and second opposite end edges;

said first and second conductive pieces each having their front faces in facing engagement and attached to said front face of said resistive material, and being spaced apart from one another to create an exposed area of said front face of said resistive material therebetween;

said first and second opposite end edges of both of said first and second conductive pieces being registered with, or located between said first and second end edges and the opposite side edges of said elongated resistance piece;

a dielectric material covering and surrounding a central portion of said resistance piece, said central portion including said exposed front face of said resistance piece and a portion of said rear face of said resistance piece opposite to said exposed front face;

said rear faces of said first and second conductive pieces being flat and presenting a flat surface protruding beyond said dielectric for connecting to a circuit board.

6. A surface mount resistor according to claim 5 wherein said first edge of said first conductive piece is in registered alignment with said first end edge of said resistance piece, and said first end edge of said second conductive piece is in registered alignment with said second end edge of said resistance piece.

7. A surface mount resistor according to claim 6 wherein said opposite side edges of said first and second conductive pieces are in registered alignment with said opposite edges of said resistance piece, respectively.

8. A surface mount resistor according to claim 5 wherein said resistance piece and said first and second conductive pieces provide a double thickness adjacent said first and second end edges of said resistance piece and only said resistance piece provides a single thickness adjacent said exposed portion thereof.

* * * * *